United States Patent [19]

Connolly

[11] 4,118,671
[45] Oct. 3, 1978

[54] TRAVELING WAVE TUBE CIRCUIT

[75] Inventor: Denis J. Connolly, North Olmsted, Ohio

[73] Assignee: The United States of America as represented by the Administrator of the National Aeronautics and Space Administration, Washington, D.C.

[21] Appl. No.: 768,795

[22] Filed: Feb. 15, 1977

[51] Int. Cl.² ............................................. H03F 3/58
[52] U.S. Cl. ..................................... 330/43; 315/3.5; 315/3.6; 301/82
[58] Field of Search .................... 315/3.5, 3.6; 330/43; 331/82

[56] References Cited

U.S. PATENT DOCUMENTS

| | | | |
|---|---|---|---|
| 3,027,453 | 3/1962 | Carter et al. | 315/3.6 X |
| 3,128,433 | 4/1964 | Edson | 330/43 |
| 3,433,992 | 3/1969 | Tancredi et al. | 315/3.6 |
| 3,678,326 | 7/1972 | Heynisch | 315/3.6 |
| 3,684,963 | 8/1972 | Henry | 330/43 |
| 3,716,745 | 2/1973 | Phillips | 315/3.6 |

FOREIGN PATENT DOCUMENTS 204,541  11/1954  Australia ................................. 315/3.6

Primary Examiner—Saxfield Chatmon, Jr.
Attorney, Agent, or Firm—N. T. Musial; J. R. Manning; J. A. Mackin

[57] ABSTRACT

A traveling wave tube (TWT) has a slow wave structure (SWS) which is severed into two or more sections. A signal path, defined below, connects the end of an SWS section to the beginning of the following SWS section. The signal path comprises an impedance matching coupler (IMC), followed by an isolator, a variable phase shifter, and a second IMC. The aggregate band pass characteristic of the components in the signal path is chosen to reject, or strongly attenuate, all frequencies outside the desired operating frequency range of the TWT and yet pass, with minimal attenuation in the forward direction, all frequencies within the desired operating frequency range. The isolator is chosen to reject, or strongly attenuate, waves, of all frequencies, which propagate in the backward direction. The aggregate phase shift characteristic of the components in the signal path is chosen to apply signal power to the beginning of the following SWS section with the phase angle yielding maximum efficiency.

4 Claims, 1 Drawing Figure

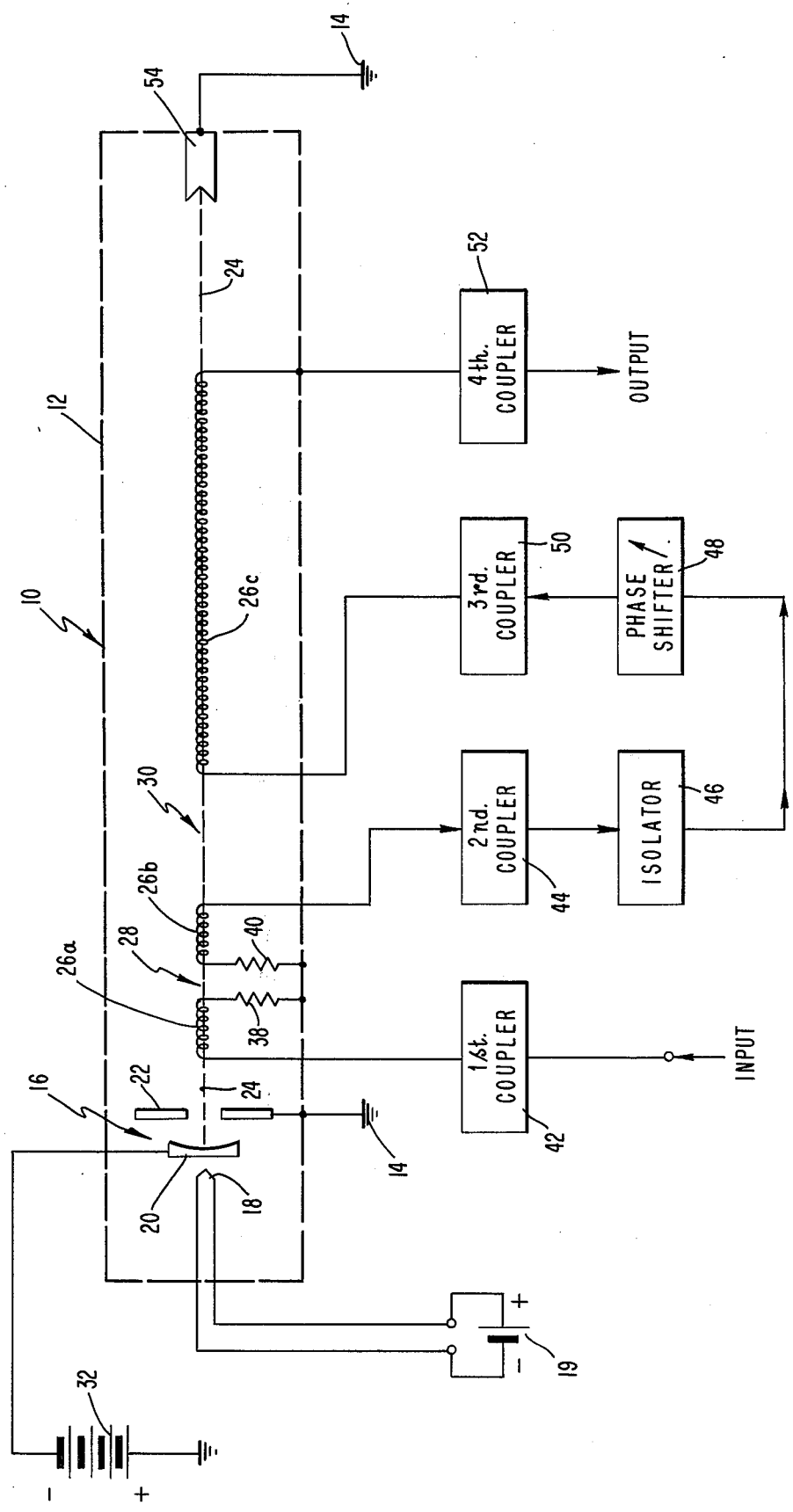

TRAVELING WAVE TUBE CIRCUIT

ORIGIN OF THE INVENTION

The invention described herein was made by an employee of the U.S. Government and may be manufactured and used by or for the Government for governmental purposes without the payment of any royalties thereon or therefor.

BACKGROUND OF THE INVENTION

The present invention relates to traveling wave tubes and more particularly to circuits for such tubes to improve their performance. It is known that undesired backward waves, as well as the desired forward waves, are present on the slow wave structure (SWS) of a traveling wave tube (TWT). If backward waves are permitted to propagate all the way from the TWT output end to the input end undesired oscillations may result. In standard TWT design practice the SWS is interrupted or severed into two or more sections. The length of each section is limited so that feedback due to the backward wave, in any section, is not large enough to lead to oscillation. In present TWT design practice (the prior art) forward and backward wave power incident on each sever is dissipated in lossy resistive terminations. The resultant loss of backward wave power has desirable effects on TWT performance. However loss of forward wave power has a rather complicated adverse effect on TWT efficiency. In some TWT designs the above adverse effect may be substantial. A theoretical discussion of this adverse effect is given in a publication by Scott: ("Why a Circuit Sever Effects Traveling Wave Tube Efficiency" by A. W. Scott. IRE Transactions ED-9, Jan. 1962, pp. 35–40.)

Scott determined that the above adverse effect can be minimized if a certain minimum length is provided for the final SWS section between the final sever and the tube output. However the above minimum length requirement may conflict with the maximum length requirement imposed by the need to prevent oscillations. Partly because of the above dilemma TWT researchers have long sought to develop circuit severs for TWT's which would dissipate only the power in the backward wave while permitting the forward wave to pass through the circuit sever with only modest attenuation. However the developmental efforts to date have all involved incorporation of ferrite material within a TWT and none have been successful enough to produce any apparent effect on TWT design practice. The abovementioned development efforts are described in the following reference and in references given therein: "Distributed Ferrite Isolation in Traveling Wave Tubes" Contract N00014-74-C0322. Annual Status Report. Sept. 2, 1975.

It is also known that TWT's tend to lose, as the beam progresses along the SWS, the desired synchronization between the electrons of the beam and the interacting wave. This tendency imposes a limit to the efficiency obtainable from a given TWT design. Various remedies have been proposed to enhance TWT efficiency by restoring, or delaying the loss of, synchronization between the beam electrons and the SWS wave. The remedies include abrupt increase in beam electron velocity, and various methods to provide abrupt or gradual decrease in SWS wave velocity. Discussions of these remedies may be found in the following publications: (1) "Improvement of Traveling Wave Tube Efficiency Through Period Tapering" N. H. Pond and R. J. Twiggs. IEEE Trans,. Electron Dev. Vol. ED-13, 1966, pp. 956–961. (2) "Applied Research on Efficiency Improvement in O-Type Traveling-Wave-Tubes", Hughes Aircraft Co. (Report RADC-TR-67-259) Apr. 1967. See also U.S. Pat. No. 3,846,664 issued Nov. 5, 1974 to King et al.

OBJECTS OF THE INVENTION

It is an object of the invention to improve the operation of traveling wave tubes.

It is another object of the invention to provide a novel combination which will enhance the efficiency of operation of traveling wave tubes.

SUMMARY OF THE INVENTION

According to the invention a traveling wave tube has a severed slow wave structure (SWS). Power developed in the section of the SWS before (upstream of) the sever is coupled through an external signal path containing an isolator a phase shifter to the section of the SWS after (downstream of) the sever. The phase shift is selected to yield enhanced or maximum efficiency. Use of the external signal path has the advantage of blocking the backward wave at the sever without diminishing the efficiency by blocking the forward wave. It also has the advantage of efficiency enhancement through phase re-synchronization.

DESCRIPTION OF THE DRAWING

The foregoing and other objects, advantages, and novel features of the invention will be more fully apparent from the following description when read in connection with the accompanying drawing in which the sole FIGURE is a schematic representation of an embodiment of the invention.

DESCRIPTION OF THE PREFERRED EMBODIMENT

In this discussion the term "upstream" means toward the electron gun 16 and "upstream end" means the end nearer the electron gun. "Downstream" means toward the collector 54.

Referring now to the drawing, a traveling wave tube 10 has an envelope 12 which may be metallic and is connected to circuit ground 14 or the common connection as is often done. The tube comprises an electron gun 16 having a heater 18 energized by a source 19, a cathode 20 heated thereby to provide electrons, and at least one more electrode, an accelerating electrode 22 having an aperture through which the electrons are drawn from the cathode to form a beam 24 of electrons. The accelerating electrode 22 is energized at a suitable negative potential with respect to the cathode 16 by a source 32 indicated by the conventional symbol. The electron beam 24 passes through a slow wave structure (SWS) which may comprise a coil 26 shown in three sections commencing with the section 26a downstream of the electron gun, progressing downstream through a so-called sever or separation 28 to a second section 26b and thence through a third section 26c following a second separation or sever 30. The drawing is schematic and not intended to show or imply dimensions, such as the relative lengths of the coil 26 between severs 28 and 30, or the lengths of the severs or separations 28 and 30. The severs 28 and 30 each provide a means to prevent or greatly diminish the direct passage of wave power from one SWS section to the next, i.e. from 26a to 26b or vice versa and from 26b to 26c or vice versa.

The SWS is shown in the drawing as a coil or helix. However the invention applies equally well to a TWT using any other type of SWS such as a coupled cavity SWS, cloverleaf SWS, interdigital line or any other SWS which has been used or may subsequently be used in linear or O-type TWTs.

The first sever 28 contains lossy terminations 38 and 40 which dissipate most of the wave power incident on the sever from either direction. This prevents adverse effects on stability and signal quality that might result if the wave power was reflected back into the respective SWS sections 26a and 26b. The lossy terminations 38 and 40 are shown on the drawing by the conventional symbol for a resistor. This first sever exemplifies one prior art approach to interrupting the flow of backward wave power along the SWS of a TWT. In a common variation of this approach (the prior art) the sever does not involve a physical interruption in the SWS. Sever action is accomplished by a localized region of high loss material, on or adjacent to the SWS, which dissipates most of the power in a SWS wave passing through the sever region in either direction. The electron beam, after passing through the SWS 26 is collected by a collector 54.

A first coupler 42 receives the high frequency input power to be amplified and provides appropriate impedance matching and coupling of the input power to the upstream, input end of the slow wave structure exemplified by coil 26 at the upstream end of the first section 26a.

A second coupler 44 receives the amplified energy from the downstream end of the second coil section 26b and thence applies it to an isolator 46. The isolator 46 may be any known isolator, preferably one that conserves and passes on substantially all of the power which it receives in the forward direction (the direction indicated by arrowheads) in order to maximize efficiency. Isolators of this type are known and are commercially available.

The output of the isolator 46 is applied to a calibrated adjustable phase shifter 48 which is used to establish the optimum phase shift. The phase shifter preferably includes a locking arrangement so its setting is not altered inadvertently once the optimum phase shift is established. Phase shifters of this type are known.

The length of the external signal path may be chosen to provide the proper phase shift vs. frequency slope. Thus, once the phase shifter is properly adjusted at the center frequency, near optimum phase shift will be achieved at all frequencies in the pass band. Usually this will require that the external signal path be as short as possible.

The output of the phase shifter is applied to a third coupler 50 which provides appropriate impedance matching and coupling of the signal power to the upstream end of SWS section 26c. The signal power is further amplified as it proceeds along SWS section 26c. The signal power is extracted from the downstream end of SWS section 26c by a fourth coupler 52 which provides coupling and impedance matching to an appropriate load.

The components 46, 47, and 48 may be arranged, in the external path, in any order desired as long as the isolator 46 is inserted with the low loss direction as indicated by arrowheads. The components 44, 46, 47, 48, and 50 are interconnected by standard wave guide or other appropriate transmission line.

A suitable isolator 46, such as a ferrite isolator or circulator, may be selected to dissipate a small fraction of the power in the energy passing through it. Thus, in a sever such as 30 employing an isolator such as 46, as compared with a sever such as 28 which employs dissipators or absorbers such as 38 and 40, there is a reduction of the cooling requirements. In other words, in a sever arranged such as the sever 28 the terminations 38 and 40 may, in some cases, absorb enough power so that care must be taken to provide a suitable cooling, either by radiation or otherwise. Because there is less dissipation required in a sever such as 30 which is associated with an isolator 46, filter 47, and phase shifter 48, there is less wasted power and correspondingly less or no cooling required.

U.S. Pat. No. 3,433,992, issued Mar. 18, 1969 to Tancredi et al. involves use of SWS wave power normally dissipated in a sever termination to enhance efficiency. Observe, however, that the arrangement by Tancredi et al. does not contain an isolator or phase slope correcting filter. The output of second coupler 44 would pass through a phase shifter and be applied to an additional SWS section located between output SWS section 26c and collector 54. The arrangement by Tancredi et al. is not intended to enhance the efficiency of the beam-wave interaction process. Rather the wave in the added SWS section would condition the exit beam for efficient collection. In U.S. Pat. No. 3,379,990 issued Apr. 23, 1968 to Scharfman, a complicated electrode arrangement is provided in order that a TWT may be used as a precision phase shifter. Neither Tancredi nor Scharfman is closely related in purpose, structure, or method to the present invention. Moreover in Tancredi and in Scharfman, the construction is complicated and expensive, whereas the construction of the embodiments of the present invention is relatively simple and inexpensive. In the present arrangement changes to the actual TWT are limited to replacement of sever terminations by two couplers, 44 and 50, identical or nearly identical to the two couplers already required, 42 and 52. The components required for the external path are all simple and inexpensive.

Accordingly, it will be understood that the invention provides an improved and more efficient traveling wave tube arrangement.

What is claimed is:

1. The combination of a traveling wave tube having a severed slow wave structure and an external signal path connecting adjacent several sections, said external signal path comprising an isolator, and a phase shifter, said external signal path having a phase vs. frequency relationship which provides a phase shift such that traveling wave tube efficiency is substantially maximized over a predetermined band of frequencies, the components in the external signal path being selected to absorb all waves passing in one direction while transmitting with minimal attenuation those waves, with frequencies within a desired operating band passing in the opposite direction.

2. The combination as claimed in claim 1, said isolator comprising a ferrite ferrite circulator.

3. The combination as claimed in claim 1, said isolator being a ferrite isolator.

4. The combination as claimed in claim 1, said external signal path containing an adjustable phase shifter.

* * * * *